United States Patent
Cho et al.

(10) Patent No.: US 8,542,139 B2
(45) Date of Patent: Sep. 24, 2013

(54) CURRENT SWITCH DRIVING CIRCUIT AND DIGITAL TO ANALOG CONVERTER

(75) Inventors: Min-Hyung Cho, Daejeon (KR); Yi-Gyeong Kim, Daejeon (KR); Jong-Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 39 days.

(21) Appl. No.: 13/310,606

(22) Filed: Dec. 2, 2011

(65) Prior Publication Data

US 2012/0154189 A1 Jun. 21, 2012

(30) Foreign Application Priority Data

Dec. 16, 2010 (KR) ........................ 10-2010-0129222

(51) Int. Cl.
*H03M 1/00* (2006.01)
(52) U.S. Cl.
USPC ........................... 341/136; 341/144; 341/145
(58) Field of Classification Search
USPC ........... 341/136, 145, 144; 345/96; 330/261; 323/315
See application file for complete search history.

(56) References Cited

U.S. PATENT DOCUMENTS

| | | | |
|---|---|---|---|
| 6,603,417 B2 | 8/2003 | Greig | |
| 6,608,578 B2 | 8/2003 | Lee et al. | |
| 6,731,170 B2 * | 5/2004 | Juang | 330/261 |
| 7,064,696 B2 * | 6/2006 | Ohkubo et al. | 341/136 |
| 2003/0052854 A1 * | 3/2003 | Juang | 345/96 |
| 2004/0150542 A1 * | 8/2004 | Kwon et al. | 341/136 |
| 2005/0174099 A1 * | 8/2005 | Ohkubo et al. | 323/315 |
| 2006/0044169 A1 * | 3/2006 | Matsumoto et al. | 341/144 |
| 2010/0164777 A1 * | 7/2010 | Cui et al. | 341/145 |

OTHER PUBLICATIONS

Seung-Chul Lee et al., "10 Bit 200 MS/s CMOS D/A Converter Employing High-Speed Limiter", Electronic Letters, Nov. 7, 2002, p. 1407-1408, vol. 38 No. 23, IEE.

* cited by examiner

*Primary Examiner* — Jean B Jeanglaude (57) ABSTRACT

Provided are a current switch driving circuit generating a signal for driving a current switch, and a digital-to-analog converter using the same. The current switch driving circuit includes a first PMOS transistor in which a source terminal is connected to a power supply terminal, a gate terminal receives an input signal, and a drain terminal outputs a driving signal, an NMOS transistor in which a drain terminal is connected to the drain terminal of the first PMOS transistor, and a gate terminal receives the input signal, a second PMOS transistor in which a source terminal is connected to a source terminal of the NMOS transistor, a gate terminal is connected to a bias voltage terminal, and a drain terminal is connected to a ground terminal, and a control current source allowing the second PMOS transistor to be maintained constantly in an ON state.

11 Claims, 7 Drawing Sheets

CURRENT SWITCH DRIVING CIRCUIT AND DIGITAL TO ANALOG CONVERTER

CROSS-REFERENCE TO RELATED APPLICATIONS

This U.S. non-provisional patent application claims priority under 35 U.S.C. §119 of Korean Patent Application No. 10-2010-0129222, filed on Dec. 16, 2010, the entire contents of which are hereby incorporated by reference.

BACKGROUND OF THE INVENTION

The present invention disclosed herein relates to a driving signal generator, and more particularly, to a current switch driving circuit generating a signal for driving a current switch, and a digital-to-analog converter (DAC) using the same.

Various factors, such as matching characteristics between elements, glitches, switching schemes or the like, exert influence on the dynamic performance of a current-driven type DAC. Among those, a factor having the biggest influence thereon is output impedance of a unit current source, which is a basic component of the current-driven type DAC. The higher the output impedance of the unit current source, the better the spurious free dynamic range (SFDR) characteristics.

As compared to a typical current-driven type DAC, the magnitude of an output voltage of a DAC for video signal processing is greater than that of the typical current-driven type DAC. In case of the output voltage of a large magnitude, that is, high output voltage, an operation region of transistors included in a DAC may be a linear region, rather than a saturation region. In this case, the transistors, included in the DAC, fail to amplify the output impedance of a unit current source. Thus, if a DAC has an output voltage of a large magnitude, the output impedance of a unit current source is lowered, thereby deteriorating the SDFR characteristics of the DAC.

SUMMARY OF THE INVENTION

The present invention provides a current switch driving circuit capable of preventing a reduction in output impedance of a unit circuit source of a digital to analog converter (DAC) with respect to a high output signal.

The present invention also provides a current switch driving circuit limiting a level of a signal for driving a current switch.

The present invention also provides a current switch driving circuit generating a driving signal permitting high-speed operation of a current switch.

Embodiments of the present invention provide current switch driving circuits including: a first PMOS transistor in which a source terminal is connected to a power supply terminal, a gate terminal receives an input signal, and a drain terminal outputs a driving signal; an NMOS transistor in which a drain terminal is connected to the drain terminal of the first PMOS transistor, and a gate terminal receives the input signal; a second PMOS transistor in which a source terminal is connected to a source terminal of the NMOS transistor, a gate terminal is connected to a bias voltage terminal, and a drain terminal is connected to a ground terminal; and a control current source allowing the second PMOS transistor to be maintained constantly in an ON state.

In other embodiments of the present invention, current switch driving circuits include: a first NMOS transistor in which a source terminal is connected to a ground terminal, a gate terminal receives an input signal, and a drain terminal outputs a driving signal; a PMOS transistor in which a drain terminal is connected to the drain terminal of the first NMOS transistor, and a gate terminal receives the input signal; a second NMOS in which a source terminal is connected to a source terminal of the PMOS transistor, a gate terminal is connected to a bias voltage terminal, and a drain terminal is connected to a power supply terminal; and a controller allowing the second NMOS transistor to be maintained constantly in an ON state.

In still other embodiments of the present invention, digital-to-analog converters include: a conversion part converting a digital signal to an analog signal; a current source generating a current of a predetermined magnitude; a current switch determining an output direction of the current generated from the current source; and a current switch driving circuit generating a digital driving signal for driving the current switch, wherein the digital driving signal of a high level is a power supply voltage, and the digital driving signal of a low level is lower than the power supply voltage and is a positive voltage.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Furthermore, when it is described that one comprises (or includes or has) some elements, it should be understood that it may comprise (or include or has) only those elements, or it may comprise (or include or have) other elements as well as those elements if there is no specific limitation.

Also, in the present application, the terms such as "part", " . . . er (or)", and the like are used to denote units of processing at least one function or operation, and these units may be implemented by hardware, software or a combination of hardware and software.

Hereinafter, it will be described about an exemplary embodiment of the present invention in conjunction with the accompanying drawings.

Figure 1:
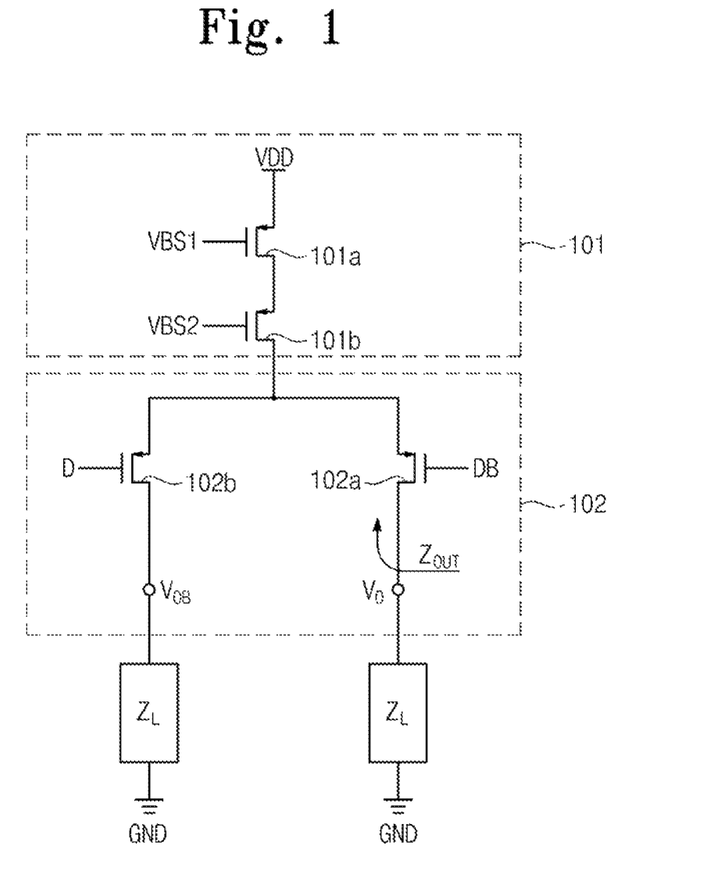
FIG. 1 is a diagram illustrating a unit current source and a current switch included in a typical digital-to-analog converter (DAC)

FIG. 1 is a view illustrating a unit current source and a current switch included in a typical digital-to-analog converter (DAC). Referring to FIG. 1, a unit current source 101 includes a first PMOS transistor 101a and a second PMOS transistor 101b, and a current switch 102 includes a third PMOS transistor 102a and a fourth PMOS transistor 102b.

The first PMOS transistor 101a and the second PMOS transistor 101b of the unit current source 101 generate a current of a predetermined magnitude. The third PMOS transistor 102a and the fourth PMOS transistor 102b of the current switch 102 determine an output direction of the current generated from the unit current source 101. Each of driving signals D and DB for driving the current switch 102 is a digital signal having voltage levels of a power supply voltage (VDD) and a ground voltage (GND) (0 V).

When an output of the unit current source 101 falls roughly within a voltage range as expressed by Equation 1 below, the third PMOS transistor 102a and the fourth PMOS transistor 102b operate in a cutoff region and a saturation region. In this case, the output impedance of the unit current source 101 is as expressed by Equation 2 below.

$$V_O < V_{TH,PM3} \qquad \text{Eq. 1}$$

$$Z_{OUT} = r_{O,PM1} \cdot g_{m,PM2} \cdot r_{O,PM2} \cdot g_{m,PM3} \cdot r_{O,PM3} \qquad \text{Eq. 2}$$

The output range of a typical current-driven type DAC falls within the range expressed by Equation 1. However, in case of a DAC for video signal processing for example, a large output voltage exceeding the range of Equation 1 may be required. In this case, the third PMOS transistor 102a and the fourth PMOS transistor 102b included in the current switch 102 operate in a cut-off region and a linear region according to the driving signals D and DB. At this time, the third PMOS transistor 102a and the fourth PMOS transistor 102b cannot serve to amplify the output impedance of the unit current source 101. Consequently, the unit current source 101 has output impedance as expressed by Equation 3, which is smaller than that of Equation 2. This low output impedance drastically impairs spurious free dynamic range (SFDR) characteristics of the DAC.

$$Z_{OUT} = r_{O,PM1} \cdot g_{m,PM2} \cdot r_{O,PM2} \qquad \text{Eq. 3}$$

Figure 2:
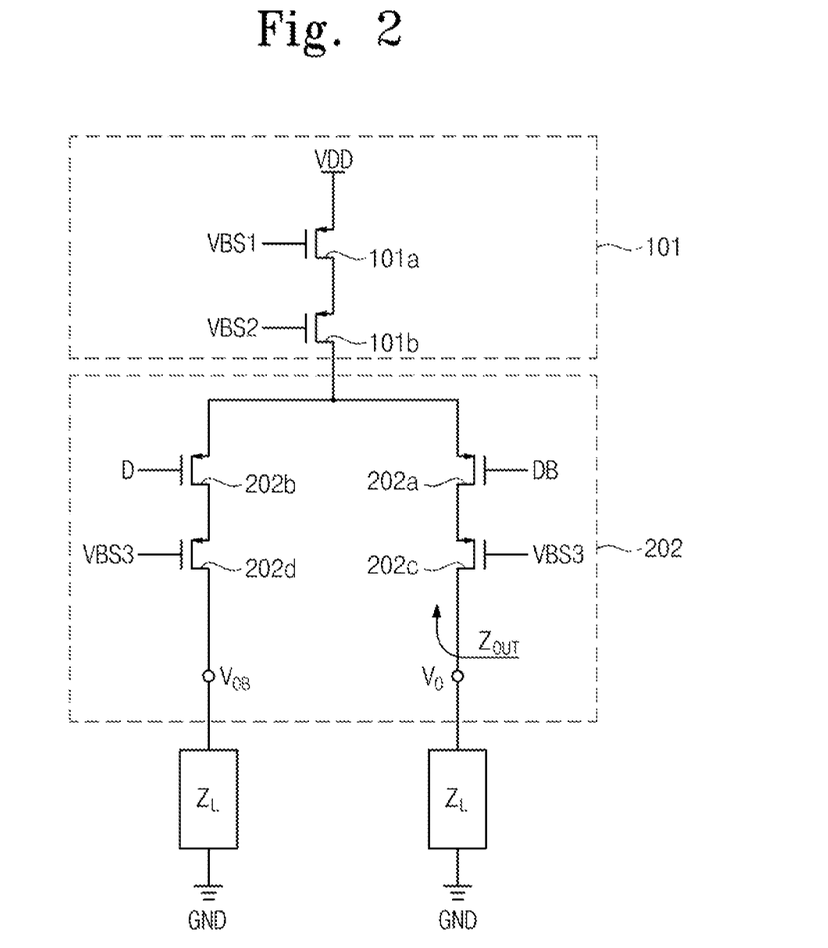
FIG. 2 is a diagram illustrating a current switch for addressing a reduction in output impedance of a unit current source in a DAC having a high output voltage.

FIG. 2 is a view illustrating a current switch to solve the limitation of the low output impedance of a unit current source in a DAC having a high output voltage. Referring to FIG. 2, the unit current source 101 includes a first PMOS transistor 101a and a second PMOS transistor 101b, and a current switch 202 includes a third PMOS transistor 202a, a fourth PMOS transistor 202b, a fifth PMOS transistor 202c, and a sixth PMOS transistor 202d.

The fifth PMOS transistor 202c and the sixth PMOS transistor 202d included in the current switch 202 of FIG. 2 constantly operate in a saturation region in the range of the high output voltage of the DAC. Accordingly, the output impedance of the unit current source included in the DAC having a high output voltage is as expressed by Equation below 4, and has a similar value to that of Equation 2 above.

$$Z_{OUT} = r_{O,PM1} \cdot g_{m,PM2} \cdot r_{O,PM2} \cdot g_{m,PM5} \cdot r_{O,PM5} \qquad \text{Eq. 4}$$

However, comparing FIG. 2 with FIG. 1, the addition of the fifth PMOS transistor 202c and the sixth PMOS transistor 202d brings about a reduction in a voltage headroom of the entire unit current source 101, thereby resulting in a reduction in an operation margin, as compared to the case where there is no fifth and sixth PMOS transistors 202c and 202d, and in the easy entry of the operation into an unstable region. In order to address the above limitations, the first PMOS transistor 101a to the fifth PMOS transistor 202b may be designed to be greater than in the case of FIG. 1; however, this may increase the size of the DAC. Furthermore, the increase in the size of the first to forth PMOS transistor 101a to 202b increases parasitic capacitor components of the unit current source 101 and thus decreases the output impedance of the unit current source 101 at high frequencies, thereby impairing the SFDR characteristics of the DAC at high frequencies.

As for another method for solving the limitation of the low output impedance of the unit current source in the DAC having a high output voltage, the same unit current source 101 of FIG. 1 is used, and the current switch 102 is driven by using driving signals D and DB having more limited voltage levels than the digital signal having voltage levels of VDD and GND (0 V).

In case of a high output voltage exceeding the output voltage range expressed by Equation 1, when the driving signals D and DB are VDD at a High level, the unit current source 101 of FIG. 1 does not undergo any limitations, caused by the driving signals D and DB, because the third PMOS transistor 102a and the fourth PMOS transistor 102b included in the current switch 102 operate in a cut-off region. However, when the driving signals D and DB of the current switch 102 are GND (0 V) at a Low level, the unit current source 101 of FIG. 1 undergoes a decrease in output impedance because the third PMOS transistor 102a and the fourth PMOS transistor 102b included in the current switch 102 operate in a linear region, rather than a saturation region.

When the driving signals D and DB of the current switch 102 have a voltage ($V_{D,Low}$), which is not 0 V, at a Low level, the output voltage range in which the third and fourth PMOS transistors 102a and 102b included in the current switch 102 of FIG. 1 operate in a saturation region may be changed from Equation 1 to Equation 5 below.

$$V_O < V_{TH,PM3} + V_{D,LOW} \qquad \text{Eq. 5}$$

In the case in which a DAC employs the unit current source 101 of FIG. 1 and the maximum output voltage level is $V_o$, a voltage level of the driving signals D and DB for driving the current switch 102 is set to ($V_o - V_{TH,PM3}$), which is not 0 V, whereby an output-impedance reduction can be prevented for a higher output voltage range without adding a separate circuit to the unit current source 101.

In such a case, a current switch driving circuit for generating a driving signal of a limited voltage level may be used, rather than an inverter type current switch driving circuit.

Current Switch Driving Circuit

Figure 3A:
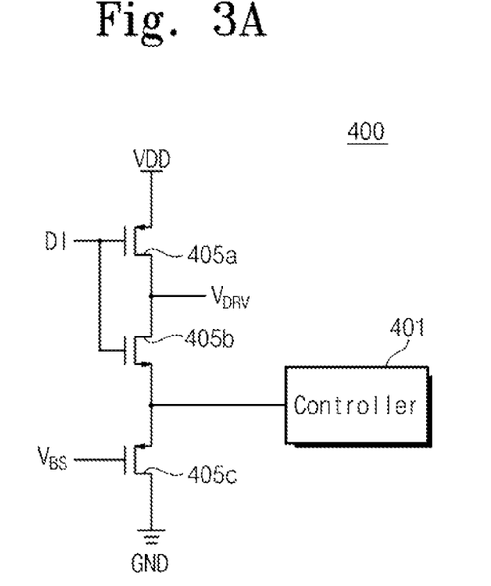
FIGS. 3A and 3B are diagrams illustrating current switch driving circuits according to an exemplary embodiment of the present invention.
Figure 3B:
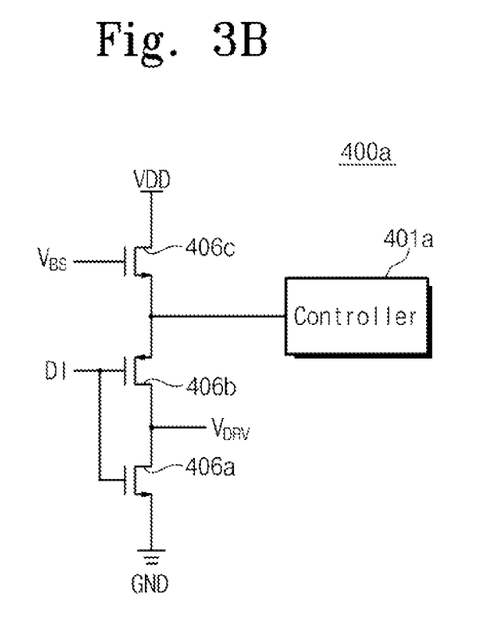

FIGS. 3A and 3B are diagrams illustrating current switch driving circuits for generating driving signals with a limited voltage level according to an exemplary embodiment of the present invention. Referring to FIG. 3A, a current switch driving circuit 400 includes a controller 401, a first PMOS transistor 405a, an NMOS transistor 405b, and a second PMOS transistor 405c.

The first PMOS transistor 405 has a source terminal connected to a power supply terminal (hereinafter, "a VDD terminal"), a gate terminal receiving an input signal DI, and a drain terminal connected to a drain terminal of the NMOS transistor 405b and outputting a current switch driving signal $V_{DRV}$.

The NMOS transistor 405b has the drain terminal connected to the drain terminal of the first PMOS transistor 405a, a gate terminal receiving the input signal DI, and a source terminal connected to a source terminal of the second PMOS transistor 405c.

The second PMOS transistor 405c has the source terminal connected to the source terminal of the NMOS transistor 405b, a gate terminal connected to a bias voltage ($V_{BS}$) terminal, and a drain terminal connected to a ground terminal (hereinafter, "a GND terminal").

The controller 401 allows the second PMOS transistor 405c to be maintained constantly in an ON state.

As for the current switch driving circuit 400 depicted in FIG. 3A, the second PMOS transistor 405c is placed after the NMOS transistor 405b, and the controller 401 is added to turn on the second PMOS transistor 405c at all times. Thus, the second PMOS transistor 405C, constantly in an ON state, may contribute to preventing a considerable decrease in operational speed occurring in a typical current switch driving circuit due to the blocking of a current path caused by a second PMOS transistor being repeatedly turned on and off. Furthermore, since the driving signal $V_{DRV}$ of a high level for driving the current switch is limited to VDD and the driving signal $V_{DRV}$ of a low level is limited to $V_{BS}+V_{TH, PM2}$, a reduction in output impedance does not occur even when the unit current source 101 of FIG. 1 is used. Consequently, in a current-driven type DAC having a high output voltage, deterioration in dynamic performance caused by a reduction in output impedance of the unit current source is prevented.

FIG. 3B illustrates a current switch driving circuit 400a corresponding to the current switch driving circuit 400 of FIG. 3A in terms of a corresponding relationship between a PMOS transistor and an NMOS Transistor. A detailed description thereof is omitted due to the similarity with FIG. 3A.

Figure 4:
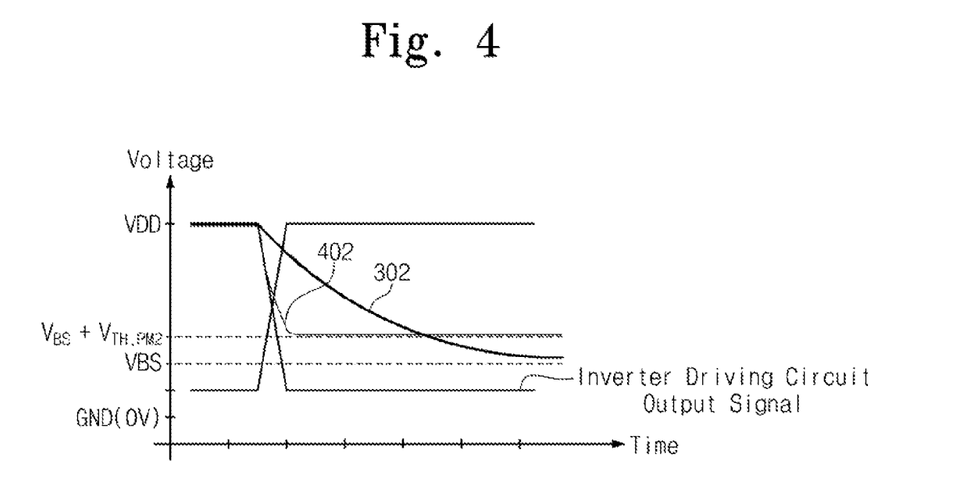
FIG. 4 is a driving signal graph of the current switch driving circuit of FIG. 3A.

FIG. 4 is a driving signal graph of the current switch driving circuit 400 of FIG. 3A.

Referring to FIG. 4, it can be appreciated that a driving signal 402 of the current switch driving circuit 400, according to this exemplary embodiment, changes from a high level (VDD) to a low level ($V_{BS}$) within a shorter period of time than a driving signal 302 of a typical current switch driving circuit. That is, since the improved change speed of the driving signal permits high-speed operations of a current switch, the current switch driving circuit 400 according to an exemplary embodiment of the present invention is usable for a DAC that operates at a high speed.

Figure 5A:
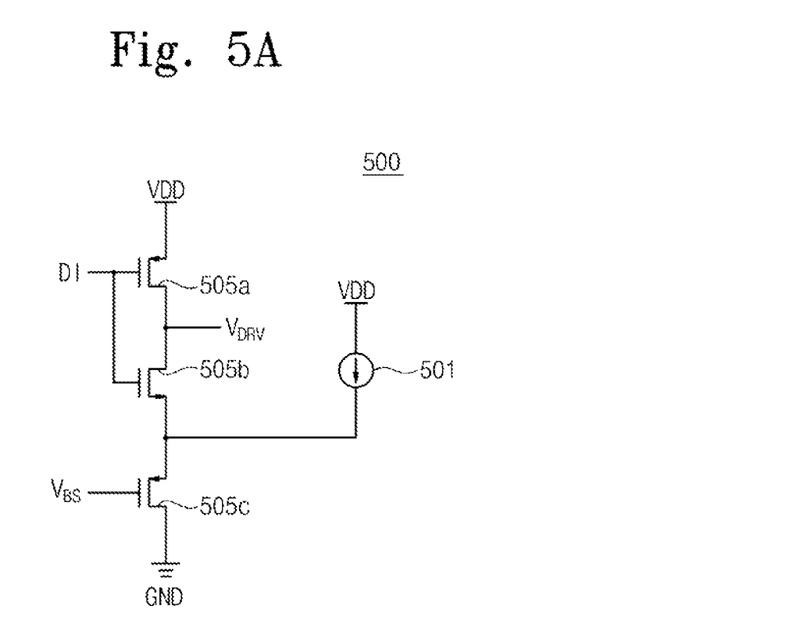
FIGS. 5A and 5B are diagrams illustrating current switch driving circuits according to another exemplary embodiment of the present invention.
Figure 5B:
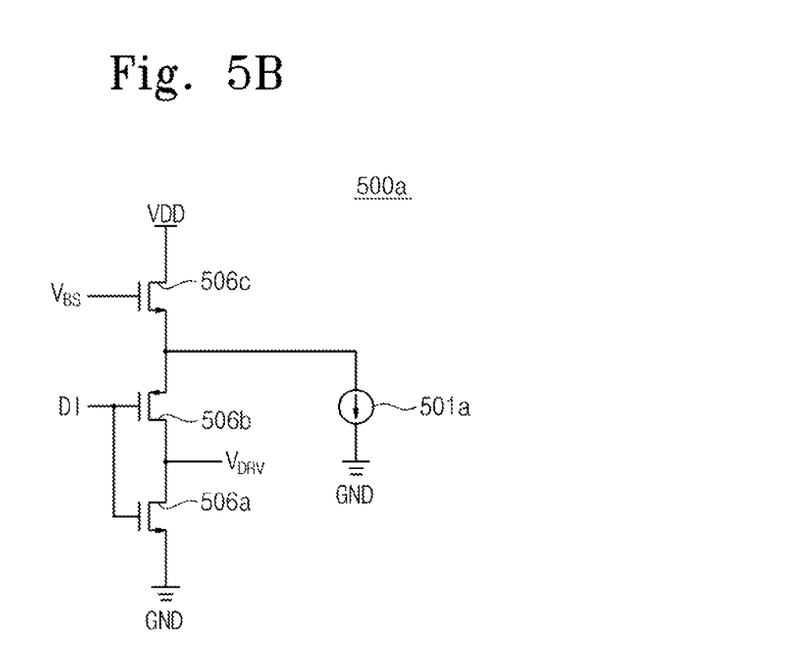

FIGS. 5A and 5B are diagrams illustrating current switch driving circuits according to another exemplary embodiment of the present invention. Referring to FIG. 5A, a current switch driving circuit 500 utilizes a control current source 501 as the controller 401 of FIG. 3A.

Elements of the current switch driving circuit 500, depicted in FIG. 5A, other than the control current source 501, are identical to those of FIG. 3A, and therefore, a detailed description thereof is omitted.

The control current source 501 of FIG. 5A is connected to a source terminal of a second PMOS transistor 505c, and supplies a bias current, allowing the second PMOS transistor 505c to be maintained constantly in an ON state, to the source terminal of the second PMOS transistor 505c.

When an input signal DI of the current switch driving circuit 500 is at a low level (0 V), an NMOS transistor 505b is turned off and a first PMOS transistor 505a is turned on. Thus, a voltage level of an output $V_{DRV}$ of the driving circuit 500 is as high as VDD. In this case, the second PMOS transistor 505c is always maintained in an ON state due to the power supply from the control current source 501, regardless of the turned off NMOS transistor 505b. Also, when the input single DI of the current switch driving circuit 500 changes to a high level (VDD), the first PMOS transistor 505a is turned off and the NMOS transistor 505b is turned on, and thus a voltage level of the output $V_{DRV}$ is as high as $V_{BS}+V_{TH, PM2}$. In this case, the second PMOS transistor 505c is constantly in an ON state due to power supply from the control current source 501, thereby allowing for the prevention of a considerable decrease in operational speed occurring in a typical current switch driving circuit due to the blocking of a current path and switching.

FIG. 5B illustrates a current switch driving circuit 500a corresponding to the current switch driving circuit 500 of FIG. 5A in terms of a corresponding relationship between a PMOS transistor and an NMOS transistor, and a detailed description thereof is omitted due to the similarity with FIG. 5A.

In the case of FIGS. 3A and 5A, a bias voltage $V_{bs}$ may be required for gate terminals of the second PMOS transistors 405c and 505c in order to generate a current switch driving signal of a limited voltage level. Thus, the voltage of the limited voltage level becomes $V_{BS}+V_{TH,PM2}$. However, when the voltage of the current switch driving signal falls within a threshold voltage range of the second PMOS transistors 405c and 505c, the bias voltage may not be required.

Figure 6A:
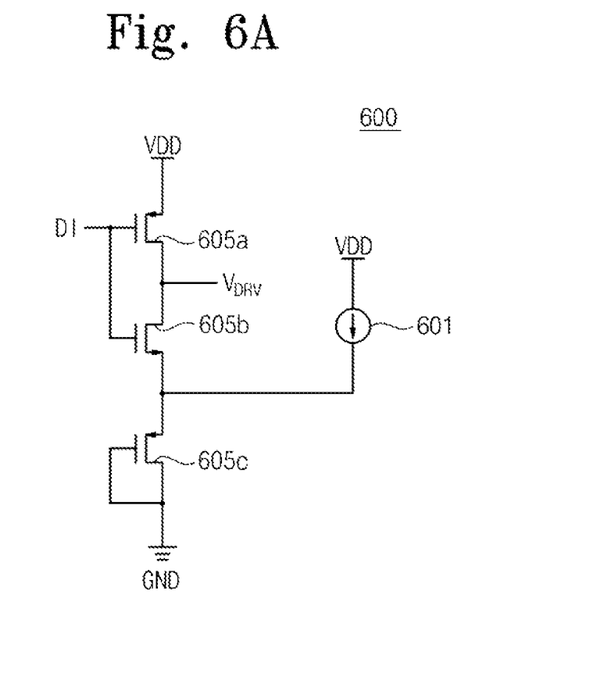
FIGS. 6A and 6B are diagrams illustrating current switch driving circuits according to still another exemplary embodiment of the present invention.
Figure 6B:
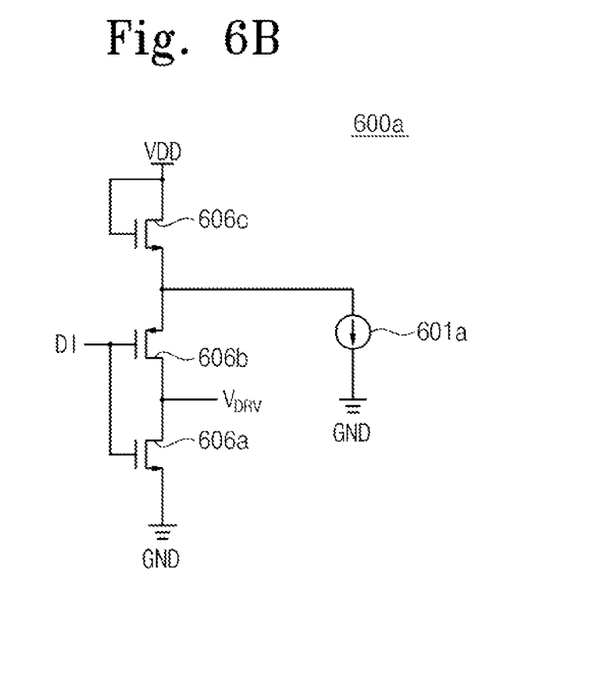

FIGS. 6A and 6B illustrate current switch driving circuits according to still another exemplary embodiment of the present invention. With reference to FIG. 6A, in comparison with the configuration depicted in FIG. 5A, a current switch driving circuit 600 includes a second PMOS transistor 605c having a gate terminal connected to a drain terminal of a second PMOS transistor 605c. That is, a bias voltage $V_{BS}$ is 0 V, and a voltage of a driving signal $V_{DRV}$ generated by the current switch driving circuit 600 at a Low level is $V_{TH, PM2}$. In this case, since a configuration for the bias voltage is not used, the current switch driving circuit 600 may have a simpler configuration than the current switch driving circuits 400 and 500 shown in FIGS. 3A and 5A.

FIG. 6B illustrates a current switch driving circuit 600a corresponding to the current switch driving circuit 600 of FIG. 6A in terms of a corresponding relationship between a PMOS transistor and an NMOS transistor, and therefore, a detailed description thereof is omitted due to the similarity with FIG. 6A.

Digital-to-Analog Converter

Figure 7:
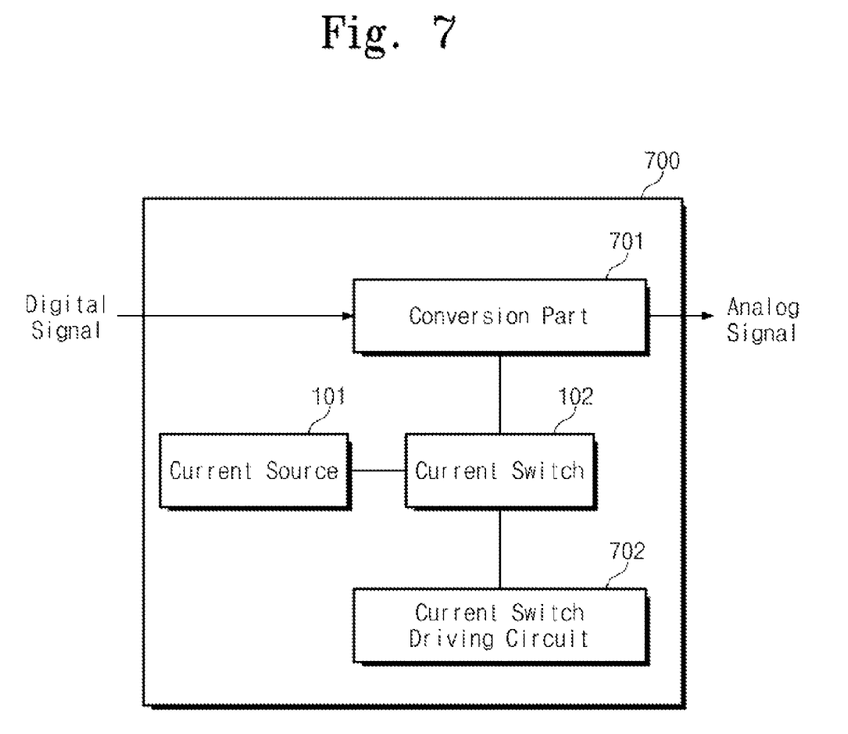
FIG. 7 is a diagram illustrating a DAC according to another exemplary embodiment of the present invention.

FIG. 7 is a view illustrating a digital-analog converter (DAC) according to another exemplary embodiment of the present invention. Referring to FIG. 7, the DAC includes a conversion part 701, the current source 101, the current switch 102, and the current switch driving circuit 702.

The current source 101, the current switch 102 and the current switch driving circuit of FIG. 7 have been described above with reference to FIGS. 1 through 3A, and therefore, a detailed description thereof is omitted.

The conversion part 701 of FIG. 7 receives a digital signal, converts the digital signal to an analog signal, and outputs the analog signal. The DAC 700 is a current driven signal converter, and the current switch 102 determines an output direction of a current generated by the current source 101 and transmits the same to the conversion unit 701 accordingly. A driving signal generated from the current switch driving circuit 702 serves to operate the current switch 102.

The current switch driving circuits 500, 500a, 600 and 600a shown in FIGS. 5A through 6B are applicable to the current switch driving circuit 702 included in the DAC 700 depicted in FIG. 7, but the present invention is not limited thereto.

Accordingly, the DAC 700 according to this exemplary embodiment of the present invention can prevent a considerable decrease in operational speed occurring in a typical current switch driving circuit due to the blocking of a current path and switching, and can achieve an enhanced conversion speed in converting a digital signal into an analog signal.

The above detailed disclosure is associated with a current switch driving circuit, generating a driving signal for driving a unit current source and a current switch consisting of PMOS transistors, but is applicable to a current switch driving circuit, generating a driving signal for driving a unit current source and a current switch consisting of NMOS transistors, in the same manner. The relationship between PMOS and NMOS transistors can be clearly understood by those skilled in the art, and therefore, a detailed description thereof is omitted.

As set forth above, according to exemplary embodiments of the present invention, the output impedance of a unit current source of a DAC does not decrease with respect to a high output signal.

Furthermore, a signal for driving a current switch has a limited level.

Also, a driving signal for driving a current switch at a high speed is generated.

The above-disclosed subject matter is to be considered illustrative, and not restrictive, and the appended claims are intended to cover all such modifications, enhancements, and other embodiments, which fall within the true spirit and scope of the present invention. For example, according to use environments or usage, there may be various modifications or alternations in detailed circuit configurations or connection relations between front and rear terminals in a control current source, and PMOS and NMOS transistors. Thus, to the maximum extent allowed by law, the scope of the present invention is to be determined by the broadest permissible interpretation of the following claims and their equivalents, and shall not be restricted or limited by the foregoing detailed description.

What is claimed is:

1. A current switch driving circuit, comprising:
a first PMOS transistor in which a source terminal is connected to a power supply terminal, a gate terminal receives an input signal, and a drain terminal outputs a driving signal;
an NMOS transistor in which a drain terminal is connected to the drain terminal of the first PMOS transistor and a gate terminal receives the input signal;
a second PMOS transistor in which a source terminal is connected to a source terminal of the NMOS transistor, a gate terminal is connected to a bias voltage terminal, and a drain terminal is connected to a ground terminal; and
a controller allowing the second PMOS transistor to be maintained constantly in an ON state.

2. The current switch driving circuit of claim 1, wherein the controller comprises a control current source.

3. The current switch driving circuit of claim 2, wherein the control current source is connected to the source terminal of the second PMOS transistor, and injects a current to the source terminal of the second PMOS transistor.

4. The current switch driving circuit of claim 3, wherein a bias voltage of the bias voltage terminal is 0 V, and the gate terminal of the second PMOS transistor is connected to the drain terminal of the second PMOS transistor.

5. A current switch driving circuit, comprising:
a first NMOS transistor in which a source terminal is connected to a ground terminal, a gate terminal receives an input signal, and a drain terminal outputs a driving signal;
a PMOS transistor in which a drain terminal is connected to the drain terminal of the first NMOS transistor, and a gate terminal receives the input signal;
a second NMOS in which a source terminal is connected to a source terminal of the PMOS transistor, a gate terminal is connected to a bias voltage terminal, and a drain terminal is connected to a power supply terminal; and
a controller allowing the second NMOS transistor to be maintained constantly in an ON state.

6. The current switch driving circuit of claim 5, wherein the controller comprises a control current source.

7. The current switch driving circuit of claim 6, wherein the control current source is connected to the source terminal of the second NMOS transistor and allows a current to flow from the source terminal of the second NMOS transistor to the ground terminal.

8. The current switch driving circuit of claim 7, wherein a bias voltage of the bias voltage terminal is 0 V, and the gate terminal of the second NMOS transistor is connected to the drain terminal of the second NMOS transistor.

9. A digital-to-analog converter, comprising:
a conversion part for converting a digital signal to an analog signal;
a current source for generating a current of a predetermined magnitude;
a current switch for determining an output direction of the current generated from the current source; and
a current switch driving circuit for generating a digital driving signal for driving the current switch,
wherein the digital driving signal of a high level is a power supply voltage, and the digital driving signal of a low level is lower than the power supply voltage and is a positive voltage.

10. The digital-to-analog converter of claim 9, wherein the current switch driving circuit comprises:
a first PMOS transistor in which a source terminal is connected to a power supply terminal of the power supply voltage, a gate terminal receives an input signal, and a drain terminal outputs a driving signal;
an NMOS transistor in which a drain terminal is connected to the drain terminal of the first PMOS transistor, and a gate terminal receives the input signal;
a second PMOS transistor in which a source terminal is connected to a source terminal of the NMOS transistor, a gate terminal is connected to a bias voltage terminal, and a drain terminal is connected to a ground terminal, and a controller allowing the second PMOS transistor to be maintained constantly in an ON state.

11. The digital-to-analog converter of claim 9, wherein the current switch driving circuit comprises:
a first NMOS transistor in which a source terminal is connected to a ground terminal, a gate terminal receives an input signal, and a drain terminal outputs a driving signal;
a PMOS transistor in which a drain terminal is connected to the drain terminal of the first NMOS transistor, and a gate terminal receives the input signal;
a second NMOS transistor in which a source terminal is connected to a source terminal of the PMOS transistor, a gate terminal is connected to a bias voltage terminal, and a drain terminal is connected to a power supply terminal of the power supply voltage, and a controller allowing the second NMOS transistor to be maintained constantly in an ON state.

* * * * *